United States Patent
Zare et al.

(10) Patent No.: US 11,569,442 B2
(45) Date of Patent: Jan. 31, 2023

(54) DIELECTRIC RETENTION AND METHOD OF FORMING MEMORY PILLAR

(71) Applicant: International Business Machines Corporation, Armonk, NY (US)

(72) Inventors: Saba Zare, Albany, NY (US); Michael Rizzolo, Delmar, NY (US); Mona A. Ebrish, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 16/903,516

(22) Filed: Jun. 17, 2020

(65) Prior Publication Data
US 2021/0399212 A1 Dec. 23, 2021

(51) Int. Cl.
 *H01L 43/12* (2006.01)
 *H01F 41/34* (2006.01)
 *G11C 11/16* (2006.01)
 *H01L 43/02* (2006.01)

(52) U.S. Cl.
 CPC ............ *H01L 43/12* (2013.01); *G11C 11/161* (2013.01); *H01F 41/34* (2013.01); *H01L 43/02* (2013.01)

(58) Field of Classification Search
 CPC ......... H01L 43/12; H01L 43/02; H01F 41/34; G11C 11/161
 See application file for complete search history.

(56) References Cited

U.S. PATENT DOCUMENTS

| | | | |
|---|---|---|---|
| 7,880,249 B2 | 2/2011 | Yuan et al. | |
| 8,125,040 B2 | 2/2012 | Kang et al. | |
| 8,372,757 B2 | 2/2013 | Mayer et al. | |
| 8,722,543 B2 | 5/2014 | Belen et al. | |
| 9,018,097 B2 | 4/2015 | Dyer et al. | |
| 9,070,869 B2 | 6/2015 | Jung et al. | |
| 9,269,893 B2 | 2/2016 | Lu et al. | |
| 10,290,722 B2 | 5/2019 | Tseng et al. | |
| 10,431,577 B2 | 10/2019 | Smith et al. | |
| 10,622,406 B2 | 4/2020 | Reznicek et al. | |
| 10,833,257 B1 * | 11/2020 | Dutta | H01L 43/12 |
| 2017/0025471 A1 | 1/2017 | Bhushan et al. | |
| 2017/0365780 A1 | 12/2017 | Narayanan et al. | |
| 2018/0261759 A1 * | 9/2018 | Bhosale | H01L 43/08 |
| 2021/0066579 A1 * | 3/2021 | Wang | H01L 43/02 |

* cited by examiner

*Primary Examiner* — Shih Tsun A Chou
(74) *Attorney, Agent, or Firm* — Daniel Morris; Otterstedt & Kammer PLLC

(57) ABSTRACT

A method of manufacturing a magnetic random access memory device includes depositing a liner on an intermediate device including an opening in a sacrificial dielectric layer, depositing a conductive metal over the liner and in the opening, removing a portion of the conductive metal while preserving the liner and a thickness of the sacrificial dielectric layer, removing a first portion of the liner by etching, wherein the liner is recessed into the opening, depositing a plurality of metallic tunnel junction layers, forming a hardmask on the plurality of metallic tunnel junction layers, and patterning the metallic tunnel junction layers to form a metallic tunnel junction stack and simultaneously clear a second portion of the liner and a portion the sacrificial dielectric layer.

12 Claims, 8 Drawing Sheets

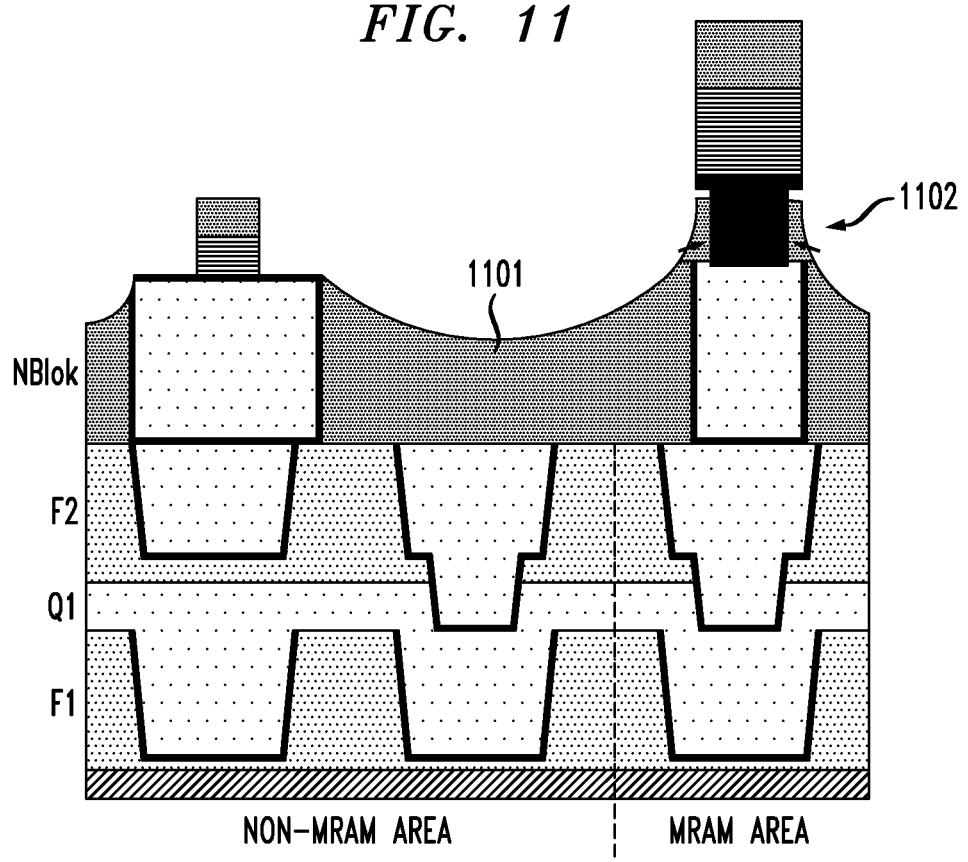

DIELECTRIC RETENTION AND METHOD OF FORMING MEMORY PILLAR

BACKGROUND

The present invention related to methods for manufacturing semiconductor devices, and more specifically, to methods for manufacturing improved MRAM devices.

Etching to form pillar-based memory elements is common for back-end of line (BEOL) devices. For example, Ion Beam Etch (IBE) is typically used to pattern metallic tunnel junctions (MTJs). The IBE gouges deep into the surrounding dielectric (e.g., nitrogen doped silicon carbide (NBLOK)), which can expose underlying features (e.g., copper (Cu) features) leading to Probemelt issues (e.g., when circuitry close to a memory pillar is exposed due to a lack of sufficient dielectric, potentially causing a short or open), shorting, etc. The thickness of the surrounding dielectric cannot typically be increased, as filling of high aspect microstuds is difficult.

BRIEF SUMMARY

According to one or more embodiments of the present invention, a method of manufacturing a magnetic random access memory device includes depositing a liner on an intermediate device including an opening in a sacrificial dielectric layer, depositing a conductive metal over the liner and in the opening, removing a portion of the conductive metal while preserving the liner and a thickness of the sacrificial dielectric layer, removing a first portion of the liner by etching, wherein the liner is recessed into the opening, depositing a plurality of metallic tunnel junction layers, forming a hardmask on the plurality of metallic tunnel junction layers, and patterning the metallic tunnel junction layers to form a metallic tunnel junction stack and simultaneously clear a second portion of the liner and a portion the sacrificial dielectric layer.

According to one or more embodiments of the present invention, a method of manufacturing a magnetic random access memory device includes depositing a liner on an intermediate device comprising an opening in a sacrificial dielectric layer, depositing a conductive metal over the liner and in the opening, removing a portion of the conductive metal while preserving the liner and a thickness of the sacrificial dielectric layer, depositing a plurality of metallic tunnel junction layers, forming a hardmask on the plurality of metallic tunnel junction layers, and patterning the metallic tunnel junction layers to form a metallic tunnel junction stack and simultaneously clear a portion of the liner and a portion the sacrificial dielectric layer.

According to one or more embodiments of the present invention, a method of manufacturing a magnetic random access memory device includes providing an intermediate device comprising a microstud with a critical dimension, depositing, selectively, a dielectric layer with an opening to the microstud disposed in the intermediate device, the opening decreasing the critical dimension, filling the opening with a pedestal material, depositing a plurality of metallic tunnel junction layers, forming a hardmask on the plurality of metallic tunnel junction layers, patterning the metallic tunnel junction layers to form a metallic tunnel junction stack on the pedestal material and simultaneously clear a portion of the dielectric layer; and clearing a remaining exposed portion of the dielectric layer by an etching.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

preservation of dielectric (e.g., SiCNH) thickness around a pillar, which provide sufficient room for memory pillar etching (e.g., by IBE) without risk of consuming the dielectric and exposing conductive layers under the memory pillar.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings:

FIGS. 8-11 show intermediate structures according to FIG. 2.

DETAILED DESCRIPTION

According to one or more embodiments of the present invention, a thickness of a SiCNH layer is preserved by eliminating a liner chemical mechanical polish (CMP). By eliminating the CMP, an additional thickness, about 15 nm, of a nitrogen doped silicon carbide (NBLOK) layer is maintained. According to some embodiments, the liner can be removed by an IBE during MTJ patterning. According to at least one embodiment, the liner is removed by a selective wet etch.

According to one or more embodiments of the present invention, a height of a dielectric layer is increased, and a selective dielectric deposition improves microstud filling. This allows a larger microstud CD and a taller height because selective interlevel dielectric (ILD) shrinks CD back to a target width, while increasing via height.

Figure 1:
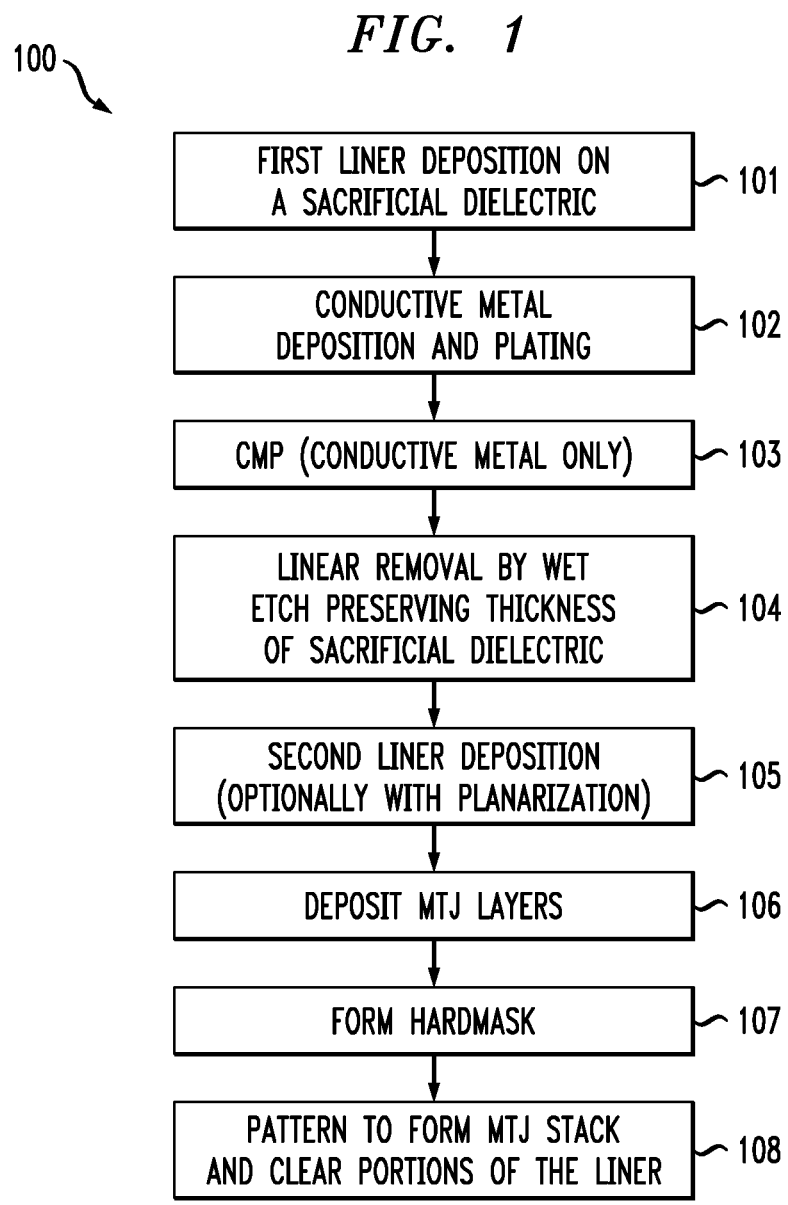
FIG. 1 is a flow diagram of a method of forming an MRAM device according to some embodiments of the present invention.

Referring to FIG. 1, a method 100 for manufacturing a semiconductor device comprises depositing a liner 101 (see 301, FIG. 3) over an intermediate device 300. According to some embodiments, the liner 301 is a bottom contact interfacial layer formed of Nb, NbN, W, WN, Ta, TaN, Ti, TiN, Ru, Mo, Cr, V, Pd, Pt, Rh, Sc, Al, and other high melting point metals or conductive metal nitrides.

According to some embodiments, the intermediate device 300 comprises middle of line (MOL) and front end of line (FEOL) circuitry 302 comprising, for example, MRAM areas 303 and non-MRAM areas 304, including a multilayer interconnect structure having ILD layers F1 and F2, an interconnect barrier/liner Q1, a sacrificial dielectric layer 305, such as NBLOK, having a thickness of about 50-150 nm, and a bottom contact interfacial layer 306 (e.g., a ferromagnetic layer of the MRAM). The ILD layers can be formed of, for example, a low-K, ULK, TEOS, BDIII, etc. The ILD layers and an interconnect barrier/liner can include via level(s). Substrate 307 or the like is disposed below the intermediate device 300. According to one or more embodiments, layer 307 is a dielectric material such as $SiO_2$, SiN or SiNC.

According to some embodiments, interconnect barrier/liner Q1 is formed of, for example, a Tantalum (Ta)-based barrier, a self-forming barrier, a Cobalt (Co) liner, a Ruthenium (Ru) liner, a Ta liner, a Titanium (Ti)-based barrier, a Ti liner, a W liner, etc.

According to some embodiments, landing pads, interconnects and via conductors, e.g., 306, of the ILD layers and the interconnect barrier/liner can be formed of Cu, CuMn, W, Co, Ru, TaN, Ta, etc. These elements can be formed by, for example, forming trenches (e.g., vias or other trenches) in one or more ILD layers, and filling the trenches with a conductive layer, such as copper. The conductive layer may be formed by, for example, PVD and plating techniques. Excess conductive material is removed by, for example, CMP, forming conductors and contacts in successive ILD layers.

Figure 4:
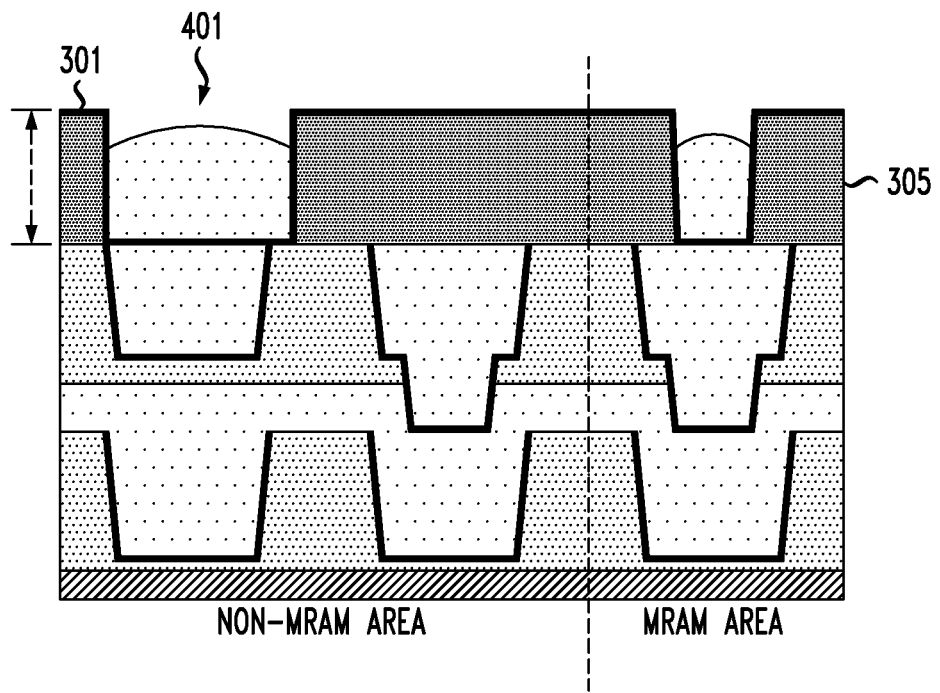

Referring again to FIG. 1, a conductive metal 308 such as Cu is deposited at 102 on the liner 301, and a CMP is performed 103, which preserves the liner 301 (see FIG. 4, where the liner 301 and the original thickness of the sacrificial dielectric layer 305 are preserved). The conductive metal 308 can be formed by, for example, plating or electroplating, growing the conductive metal 308 in bulk to fill any open trenches. At 104 the liner 301 is removed by, for example, a wet etch using an etchant (e.g., etch-J) having a high selectivity for the sacrificial dielectric layer 305 (see FIG. 5). That is, the liner 301 may be recessed into the vias. Line 501 shows a typical height after a conventional liner polish to demonstrate how the wet liner etch preserves the thickness of layer 305.

According to at least one embodiment, the liner is not removed (i.e., block 104 is optional), which results in a lower percentage of sacrificial dielectric layer 305 being removed by a later processing (e.g., IBE at block 108).

According to some embodiments, an additional layer of liner material 604 is deposited (e.g., similar to liner 301) (see FIG. 1, block 105) to protect portions of a lower metal conductive material, e.g., 605.

Figure 3:
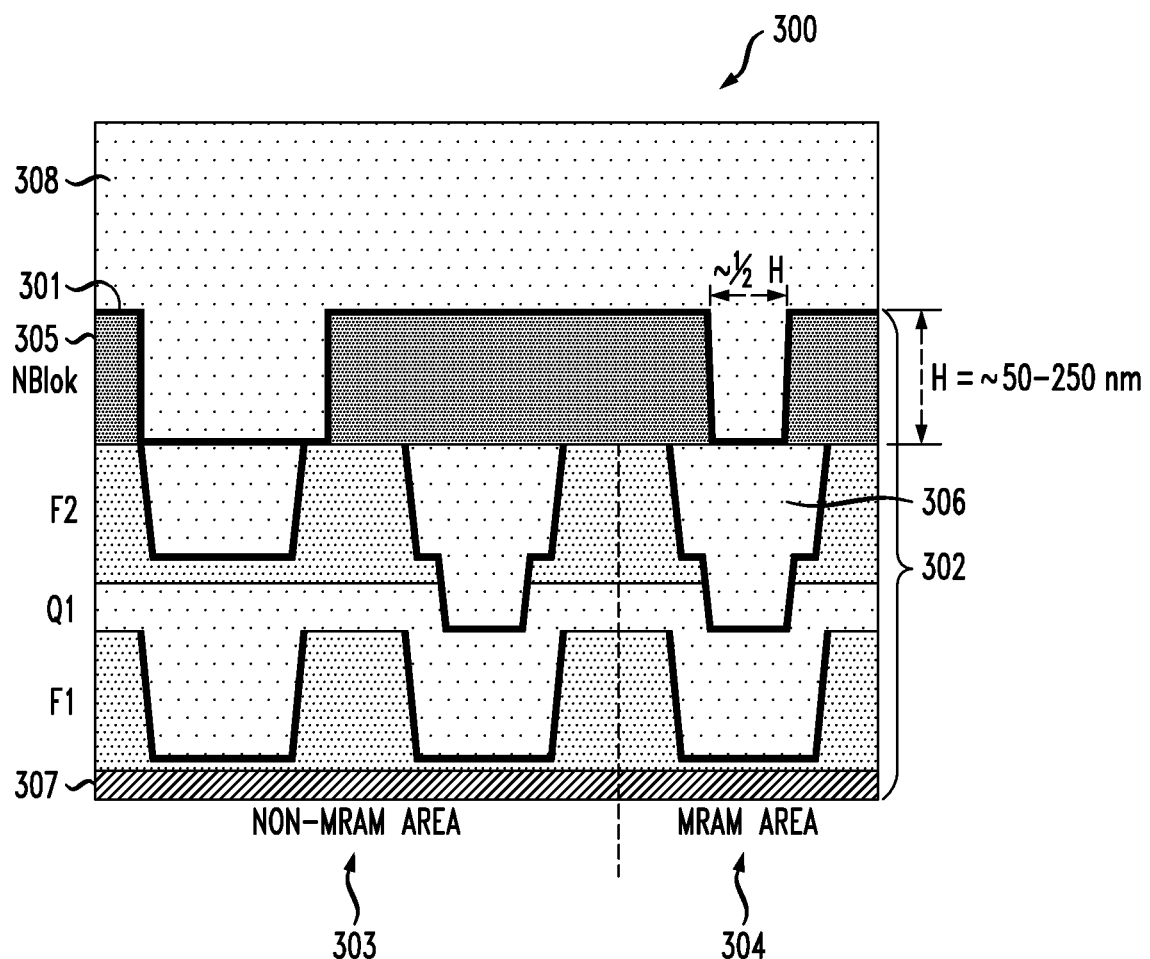
FIGS. 3-7 show intermediate structures according to FIG. 1.
Figure 5:
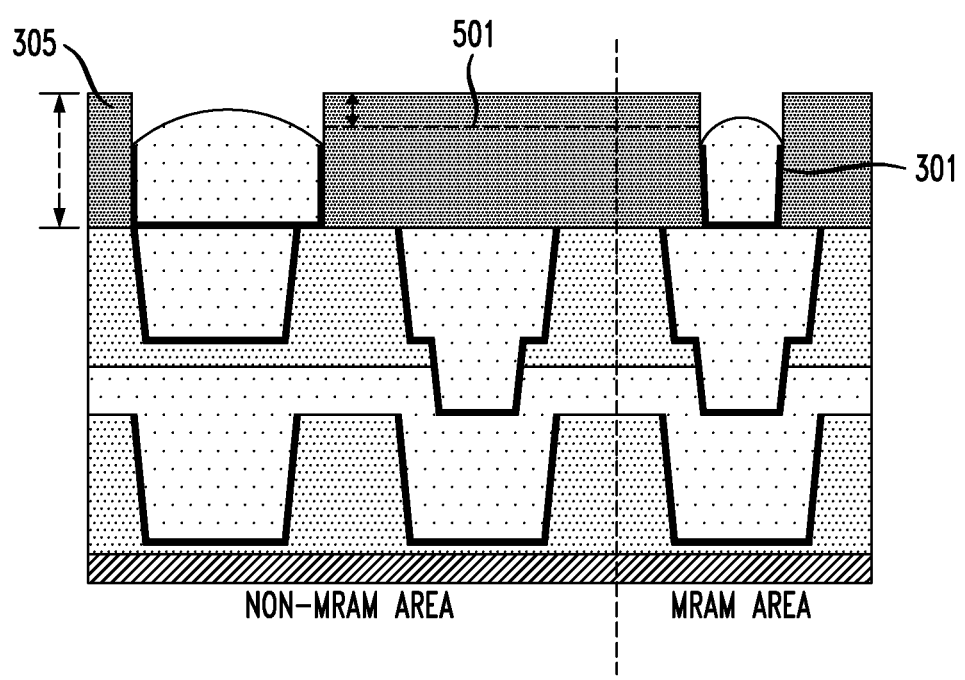
Figure 6:
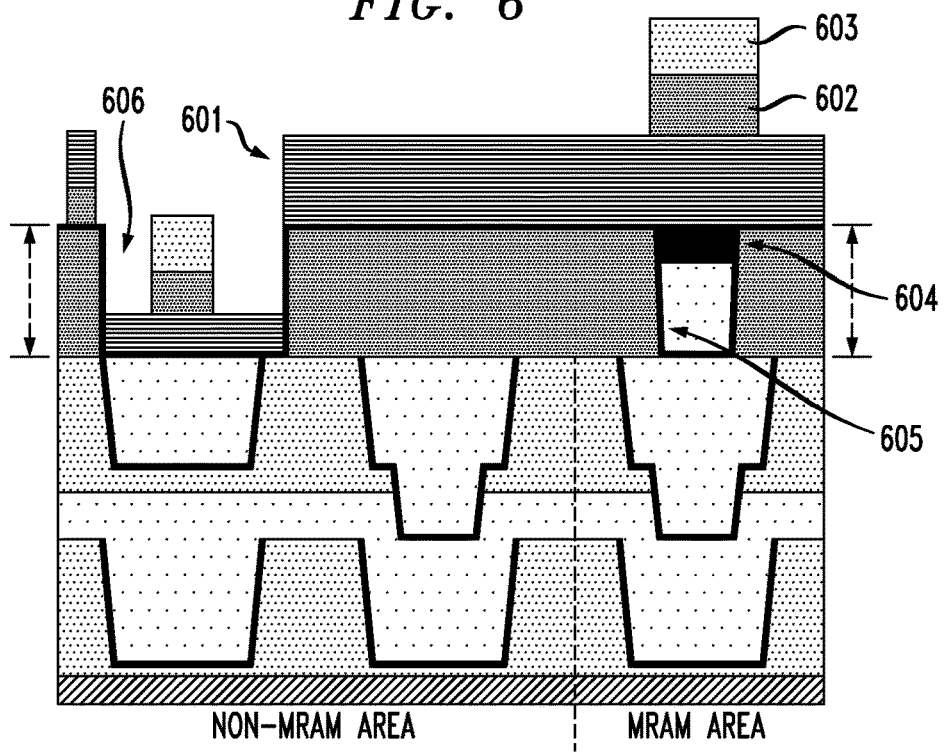
Figure 7:
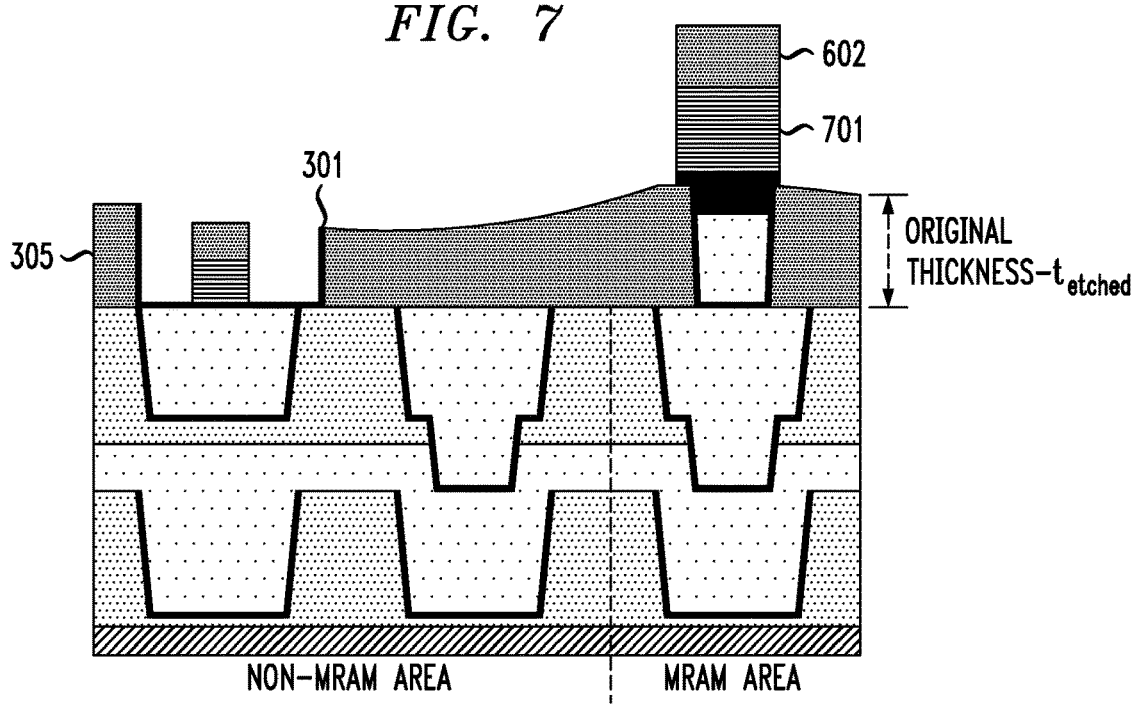

It should be appreciated that a variety of patterning processes can applied in the non-MRAM area. For example, FIGS. 3-5 show the conductive metal in a trench in the non-MRAM area 401, while FIGS. 6-7 show a structure in which the non-MRAM area is patterned to form a trench 606 following the removal of the liner 301 processing of the lower metal conductive material 605 (e.g., FIG. 7 showing an thickness of the sacrificial dielectric layer 305 being the original thickness minus the thickness (t) etched). One of ordinary skill in the art would appreciate that these and other processes can be applied for a given application/device in the non-MRAM area.

At block 106 a plurality of MTJ layers 601 are deposited. At block 107 a hardmask 603 is formed. The formation of the hardmask at 107 can including forming a patterned dielectric layer 602, such as Tetraethoxysilane (TEOS). According to one or more embodiments of the present invention, the device is patterned at 108 to form MTJ stacks 701 and clear portions of the liners 301 and 604, and portions of the sacrificial dielectric layer 305. According to some embodiments, the patterning 108 comprises an IBE. According to some embodiments, the dielectric layer 602 protects the Cu fill (e.g., 605) and the sidewalls of the MTJ stack 701 from redeposition of Cu fill during patterning. According to one or more embodiments of the present invention, the MTJ stack 701 is a generic representation including seed layers, fixed magnetic layers, free magnetic layers, tunnel barrier(s), oxide cap(s), etc.

According to some embodiments, the liners 301 and 604 are cleared during the patterning 108, thereby preserving more of the sacrificial dielectric layer 305, since a thickness of the sacrificial dielectric layer 305 is not reduced by a conventional removal of the liner 301 earlier in a manufacturing process.

Figure 2:
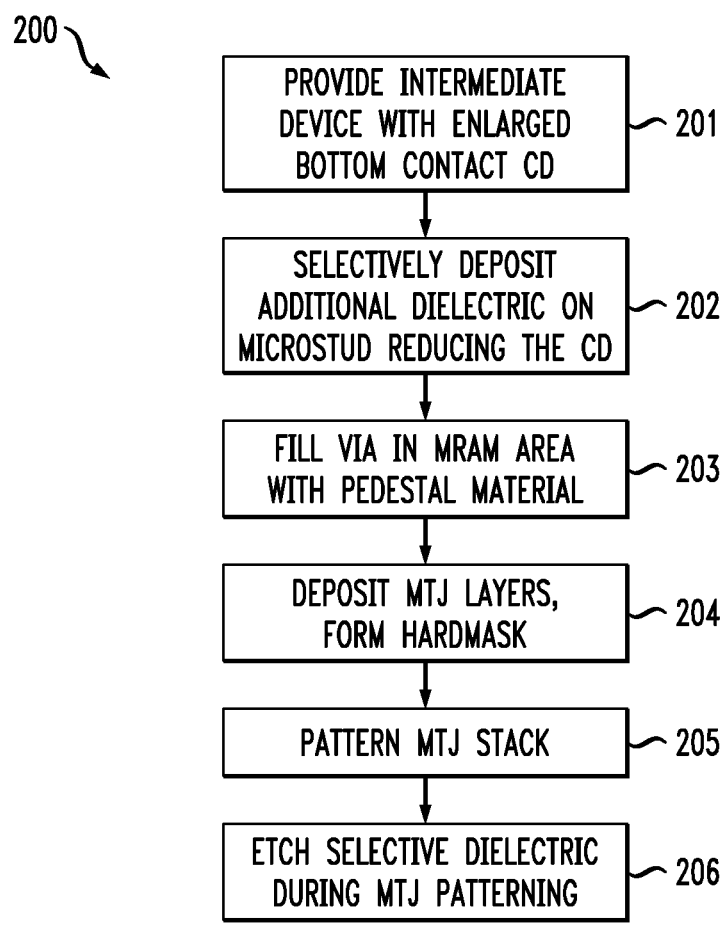
FIG. 2 is a flow diagram of a method of forming an MRAM device according to some embodiments of the present invention.
Figure 8:
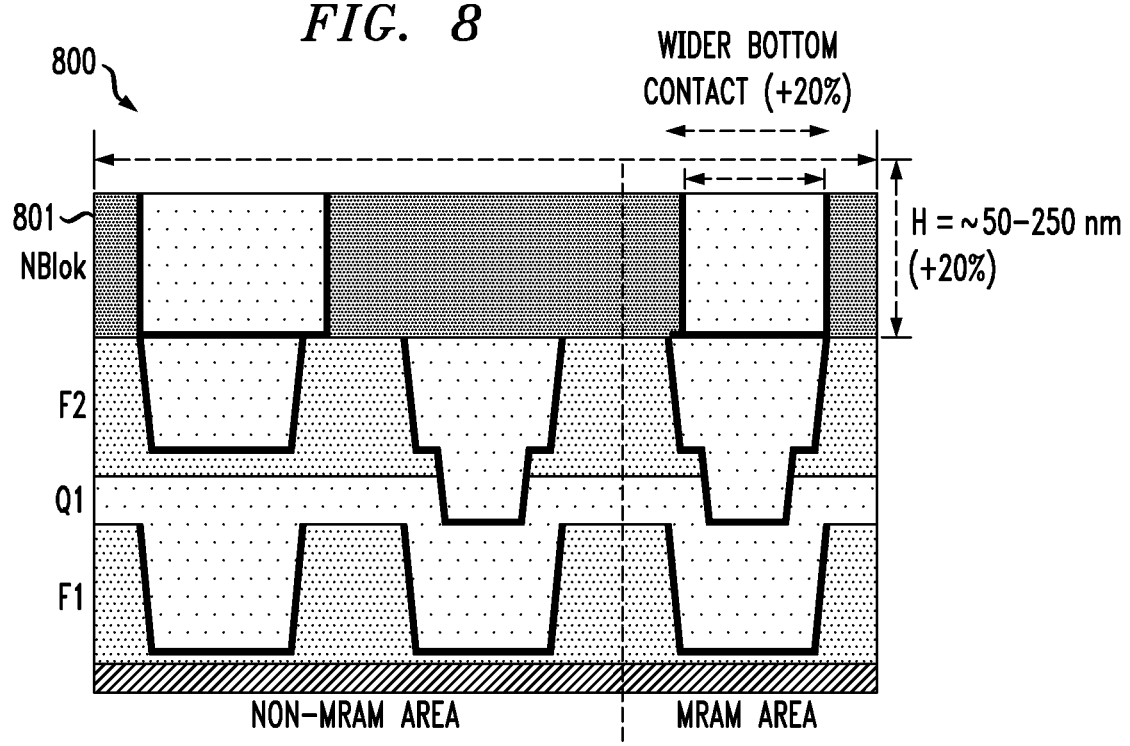
Figure 9:
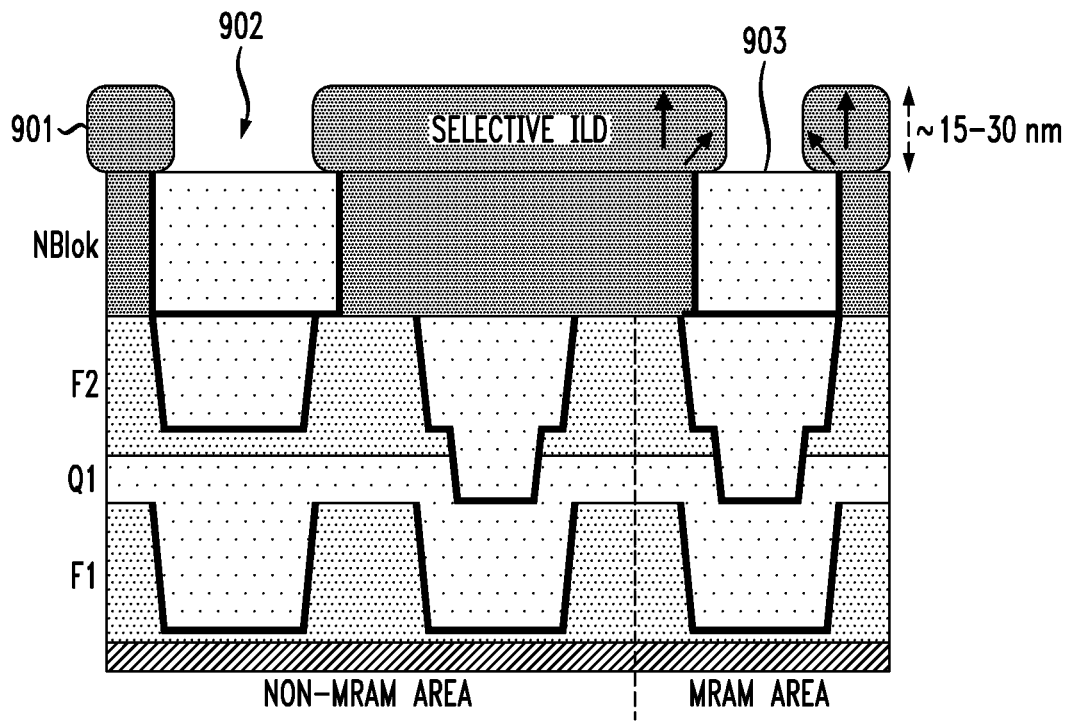
Figure 10:
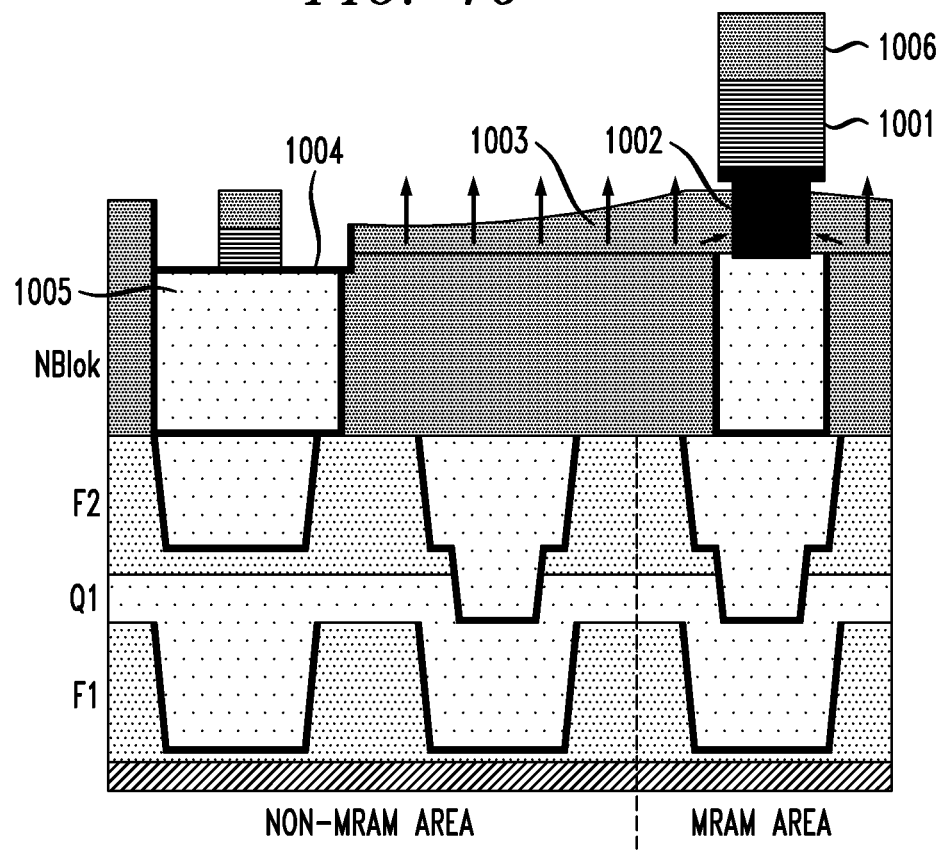

Referring to FIG. 2, a method 200 for manufacturing a semiconductor device comprises providing an intermediate device 201 (see 800, FIG. 8) having an enlarged bottom contact CD (critical dimension), e.g., with width between about 20-100 nm, and preferable about 20% greater than 60 nm, and a height (H) of the microstud (see 903, FIG. 9) is increased to maintain the same aspect ratio (as compared to the intermediate microstud shown in FIG. 3). Other dimensions of the microstud are contemplated, for example, where the height of the microstud 903 is between about 50-250 nm, and the CD of the microstud 903 is about half the height. As shown in FIG. 8, the height of the sacrificial dielectric layer 801 (e.g., after CMP) is about 50-250 nm, where about 20% of the layer is removed by the CMP. The intermediate device 800 can be obtained by, for example, a CMP removing an overfill of the conductive metal and an upper portion of a liner (not shown). At block 202, a dielectric layer 901 is selectively deposited (e.g., with openings 902 to contacts below) to decrease the CD over a microstud 903. According to some embodiments, the height of the selective ILD 901 is about 15-30 nm. At block 203, a via in the MRAM area 303 (i.e., above the microstud 903) is filled with a pedestal material (see 1002, FIG. 10) and optionally polished flat. At block 204, a plurality of MTJ layers are deposited and a hardmask 1006 is formed. At block 205, MTJ layers are patterned to form MTJ stacks 1001, disposed above the pedestal material 1002. Note that a portion of the additional dielectric layer 1003 remains after patterning. At block 206, the additional dielectric layer (e.g., an NBLOK formed of SiCNH) is cleared (see FIG. 11), e.g., by an IBE ending in the sacrificial dielectric layer 1101. According to one or more embodiments, a portion of the dielectric layer 1102 below the metallic tunnel junction stack remains after the clearing.

According to some embodiment the method includes depositing an additional layer of liner material 1004 (see FIG. 10) is deposited (e.g., similar to liner 301) prior to the MTJ layers 601 to protect a lower metal conductive material 1005.

Recapitulation:

According to some embodiments, a method of manufacturing a magnetic random access memory (MRAM) device comprises depositing a first liner 101 on an intermediate device comprising one or more openings in a sacrificial dielectric layer, depositing a conductive metal (e.g., Cu) 102 over the liner and in the openings, removing a portion of the conductive metal 103 while preserving the liner and a thickness of the sacrificial dielectric layer, removing a first portion of the first liner 104 by etching, wherein the liner is recessed into the openings, depositing a plurality of metallic tunnel junction layers 106, forming a hardmask 107 on the plurality of metallic tunnel junction layers, and patterning the metallic tunnel junction layers to form a metallic tunnel junction stack and simultaneously clear a second portion of the liner and a portion the sacrificial dielectric layer 108.

According to one or more embodiments of the present invention, a method of manufacturing a magnetic random access memory device includes depositing a liner 101 on an intermediate device comprising one or more openings in a sacrificial dielectric layer, depositing a conductive metal 102 over the liner and in the openings, removing a portion of the conductive metal 103 while preserving the liner and a thickness of the sacrificial dielectric layer, depositing a plurality of metallic tunnel junction layers 106, forming a hardmask 107 on the plurality of metallic tunnel junction layers, and patterning the metallic tunnel junction layers to form a metallic tunnel junction stack and simultaneously clear a portion of the liner and a portion the sacrificial dielectric layer 108.

According to one or more embodiments of the present invention, a method of manufacturing a magnetic random access memory device includes providing an intermediate device comprising a microstud with a critical dimension 201, depositing, selectively, a dielectric layer 202 with an opening to the microstud disposed in the intermediate device, the opening decreasing the critical dimension, filling the opening with a pedestal material 203, depositing a plurality of metallic tunnel junction layers, forming a hardmask 204 on the plurality of metallic tunnel junction layers, patterning the metallic tunnel junction layers 205 to form a metallic tunnel junction stack on the pedestal material and simultaneously clear a portion of the dielectric layer; and etching a remaining exposed portion of the dielectric layer by an etching 206 (e.g., the etch used to pattern the metallic tunnel junction layers at 205).

Furthermore, it should be noted that any of the methods described herein can include an additional step of providing a computer system controlling appropriate processing machinery to implement a method 100/200 for manufacturing an improved MRAM device. Further, a computer program product can include a tangible computer-readable recordable storage medium with code adapted to be executed to carry out one or more method steps described herein, including the provision of the system with the distinct software modules.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a magnetic random access memory (MRAM) device, the method comprising:
   depositing a first liner on an intermediate device comprising an opening in a sacrificial dielectric layer;
   depositing a conductive metal over the first liner and in the opening;
   removing a portion of the conductive metal while preserving the first liner and a thickness of the sacrificial dielectric layer;
   removing a first portion of the first liner by selective etching, wherein the first liner is recessed into the opening;
   depositing a plurality of metallic tunnel junction layers;
   forming a hardmask on the plurality of metallic tunnel junction layers; and
   patterning the metallic tunnel junction layers to form a metallic tunnel junction stack and simultaneously clear a second portion of the first liner and a portion the sacrificial dielectric layer.

2. The method of claim 1, after removing the first portion of the liner and prior to depositing the metallic tunnel junction layers, further comprising:
   depositing a second liner;
   removing a portion of the second liner in a non-MRAM area of the MRAM device, wherein a remaining portion of the second liner is disposed on the conductive material in an MRAM area of the MRAM device; and
   removing an exposed portion of the conductive metal in the non-MRAM area.

3. The method of claim 1, wherein a thickness of the sacrificial dielectric layer around the metallic tunnel junction stack after patterning completely surrounds the conductive metal below the metallic tunnel junction stack.

4. The method of claim 1, wherein the depositing of the conductive metal is a deposition of a copper metal.

5. The method of claim 1, wherein the selective etching is a wet etch.

6. A method of manufacturing a magnetic random access memory (MRAM) device, the method comprising:
   depositing a first liner on an intermediate device comprising an opening in a sacrificial dielectric layer;
   depositing a conductive metal over the first liner and in the opening;
   removing a portion of the conductive metal while preserving the first liner and a thickness of the sacrificial dielectric layer;
   after removing the portion of the conductive metal and prior to depositing a plurality of metallic tunnel junction layers;
   depositing a second liner;
   removing a portion of the second liner in a non-MRAM area of the MRAM device, wherein a remaining portion of the second liner is disposed on the conductive material in an MRAM area of the MRAM device; and
   removing an exposed portion of the conductive metal in the non-MRAM area;
   depositing the plurality of metallic tunnel junction layers;
   forming a hardmask on the plurality of metallic tunnel junction layers; and patterning the metallic tunnel junction layers to form a metallic tunnel junction stack and simultaneously clear a portion of the first liner and a portion the sacrificial dielectric layer.

7. The method of claim 6, wherein a thickness of the sacrificial dielectric layer around the metallic tunnel junction stack after patterning completely surrounds the conductive metal below the metallic tunnel junction stack.

8. A method of manufacturing a magnetic random access memory (MRAM) device, the method comprising:
providing an intermediate device comprising a microstud with a critical dimension;
depositing, selectively, a dielectric layer with an opening to the microstud disposed in the intermediate device, the opening decreasing the critical dimension;
filling the opening with a pedestal material;
depositing a plurality of metallic tunnel junction layers;
forming a hardmask on the plurality of metallic tunnel junction layers;
patterning the metallic tunnel junction layers to form a metallic tunnel junction stack on the pedestal material and simultaneously clear a portion of the dielectric layer; and
clearing a remaining exposed portion of the dielectric layer by an etching.

9. The method of claim 8, wherein the opening filed with the pedestal material comprises filling a first opening disposed in an MRAM area of the MRAM device with the pedestal material, wherein a second opening in a non-MRAM area is not filled with the pedestal material.

10. The method of claim 8, further comprising forming the microstud in a sacrificial layer of the intermediate device, wherein the dielectric layer is deposited on the sacrificial layer.

11. The method of claim 10, wherein a thickness of the sacrificial layer around the metallic tunnel junction stack after patterning completely surrounds the microstud below the metallic tunnel junction stack.

12. The method of claim 8, wherein a portion of the dielectric layer below the metallic tunnel junction stack remains after the clearing.

* * * * *